(12) United States Patent
Funabasama et al.

(10) Patent No.: US 12,471,307 B2
(45) Date of Patent: Nov. 11, 2025

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Tomoyuki Funabasama, Yokkaichi Mie (JP); Toshitaka Miyata, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 432 days.

(21) Appl. No.: 17/898,893

(22) Filed: Aug. 30, 2022

(65) Prior Publication Data
US 2023/0307540 A1 Sep. 28, 2023

(30) Foreign Application Priority Data
Mar. 24, 2022 (JP) .................. 2022-047895

(51) Int. Cl.
*H10D 30/60* (2025.01)
*H01L 21/265* (2006.01)
(Continued)

(52) U.S. Cl.
CPC ..... *H10D 30/601* (2025.01); *H01L 21/26506* (2013.01); *H01L 21/266* (2013.01); *H10D 64/021* (2025.01)

(58) Field of Classification Search
CPC ............ H10D 30/6717; H10D 30/601; H10D 30/605; H10D 30/608; H10D 30/022;
(Continued)

(56) References Cited

U.S. PATENT DOCUMENTS 6,030,863 A 2/2000 Chang et al.
6,153,477 A * 11/2000 Gardner ............... H10D 64/691
438/179

(Continued)

FOREIGN PATENT DOCUMENTS

JP H11-284184 A 10/1999
JP 2008-124393 A 5/2008
(Continued)

OTHER PUBLICATIONS

Al-Bayati, A., et al., "Exploring the Limits of Pre-Amorphization Implants on Controlling Channeling and Diffusion of Low Energy B Implants and Ultra Shallow Junction Formation," 2000 International Conference on Ion Implantation Technology Proceedings, IEEE, pp. 54-57 (2000) (5 pages). https://www.researchgate.net/publication/271424540_Exploring_the_limits_of_pre-amorphization_implants_on_controlling_channeling_and_diffusion_of_low_energy_B_implants_and_ultra_shallow_junction_formation.

(Continued)

*Primary Examiner* — Julio J Maldonado
*Assistant Examiner* — Nathan Pridemore
(74) *Attorney, Agent, or Firm* — Foley & Lardner LLP

(57) ABSTRACT

A semiconductor device comprises a transistor. The transistor includes: a gate insulating film formed on a semiconductor substrate; a gate electrode formed on the gate insulating film and containing germanium at least in an upper (Continued)

region of the electrode; a source region formed in the semiconductor substrate; and a drain region formed in the semiconductor substrate.

9 Claims, 6 Drawing Sheets

(51) Int. Cl.
 *H01L 21/266* (2006.01)
 *H10D 64/01* (2025.01)
(58) Field of Classification Search
 CPC ........... H10D 30/0229; H10D 30/0281; H10D 30/01; H10D 84/0172–0177; H10D 84/014; H10D 84/0144; H10D 84/0181; H10D 84/013; H10D 84/017; H10D 64/021; H10D 30/0221; H10D 30/0227; H10D 30/603; H10D 64/662; H10D 84/0179; H10D 84/038; H10D 84/856; H01L 21/2205; H01L 21/26506; H01L 21/223; H01L 21/28035; H01L 21/28044; H01L 21/28105; H01L 21/823828; H01L 21/823842; H01L 21/823835; H01L 21/82345; H01L 21/823462; H01L 21/823857; H01L 21/823418; H01L 21/823814; H01L 21/2652; H01L 21/66598; H01L 25/072; H01L 29/7833; H01L 21/266
 USPC ............................................. 438/286, 305 W
 See application file for complete search history.

(56) References Cited

U.S. PATENT DOCUMENTS

| 6,784,506 | B2* | 8/2004 | Xiang | ................... | H10D 64/663 |
| | | | | | 257/412 |
| 2008/0113480 | A1 | 5/2008 | Nishida et al. | | |
| 2009/0001371 | A1 | 1/2009 | Mowry et al. | | |
| 2017/0243950 | A1* | 8/2017 | Liu | ................... | H01L 21/26513 |
| 2020/0051908 | A1 | 2/2020 | Matsuura | | |
| 2021/0272811 | A1* | 9/2021 | Ji | ....................... | H10D 84/0137 |
| 2022/0406935 | A1* | 12/2022 | Woo | ..................... | H10D 30/603 |

FOREIGN PATENT DOCUMENTS

| JP | 2008-187008 A | 8/2008 |
| JP | 2010-532572 A | 10/2010 |
| JP | 2020-027865 A | 2/2020 |

OTHER PUBLICATIONS

Dong, Y., et al., "A unified interdiffusivity model and model verification for tensile and relazed SiGe interdiffusion over the full germanium content range," Journal of Applied Physics, 111, 044909 (2012) (11 pages). AIP Publishing, 2012, DOI: http://dx.doi.org/10.1063/1.3687923.

Miyata, T., et al., "150 GHz FMAX with High Drain Breakdown Voltage Immunity by Multi Gate Oxide Dual Work-Function (MGO-DWF)-MOSFET," IEDM, 25-8 (2015) (3 pages).

* cited by examiner

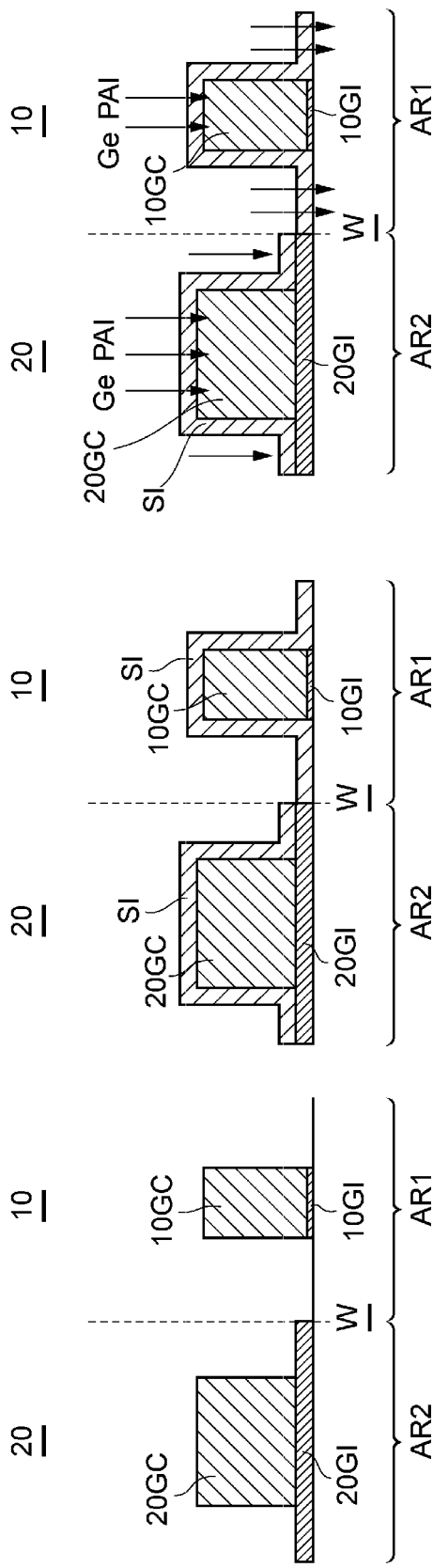

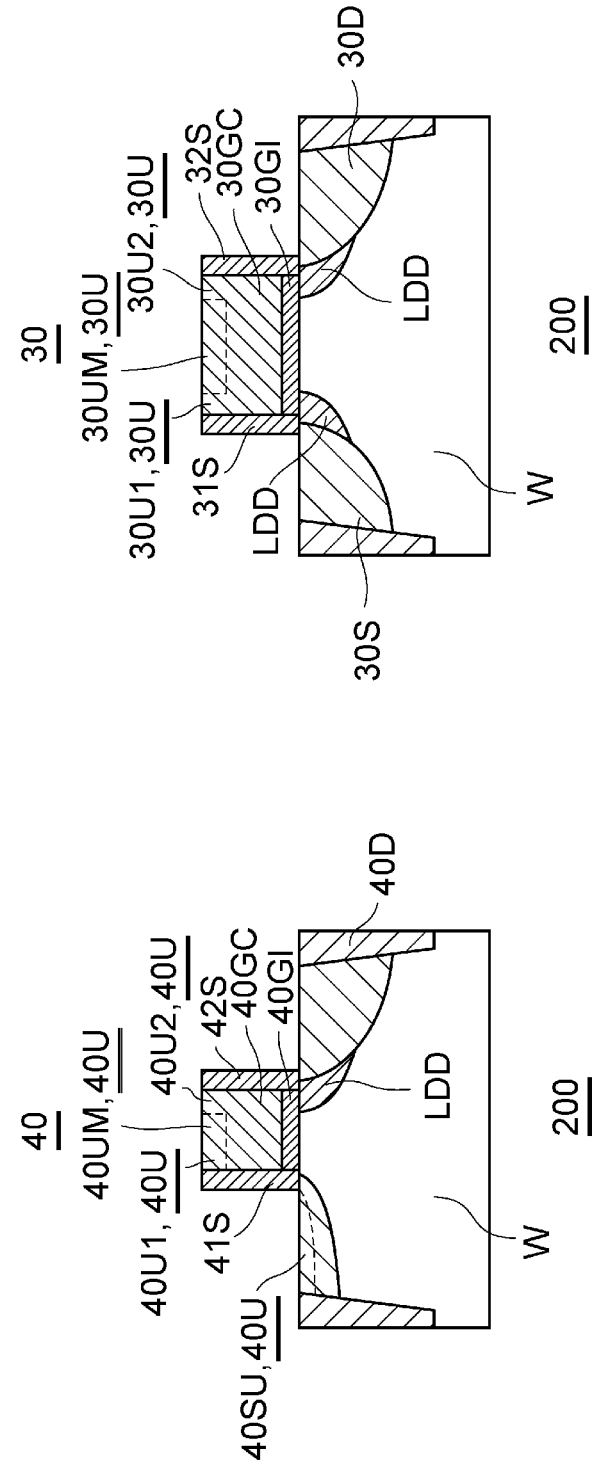

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-047895, filed Mar. 24, 2022, the entire contents of which are incorporated herein by reference.

FIELD

Embodiments described herein relate generally to a semiconductor device and a method for manufacturing the semiconductor device.

BACKGROUND

Transistors preferably have little variation in the threshold voltage. Some technique have been proposed to reduce a variation in the threshold voltage based on selective pre-amorphization of source/drain regions of the transistor while preventing pre-amorphization of a gate electrode.

DESCRIPTION OF THE DRAWINGS

FIGS. 2A through 2C are schematic diagrams illustrating a method for manufacturing the semiconductor device according to the embodiment.

FIGS. 4A and 4B are cross-sectional views schematically showing the configuration of transistors provided in a semiconductor device according to another embodiment.

DETAILED DESCRIPTION

Figure 1:
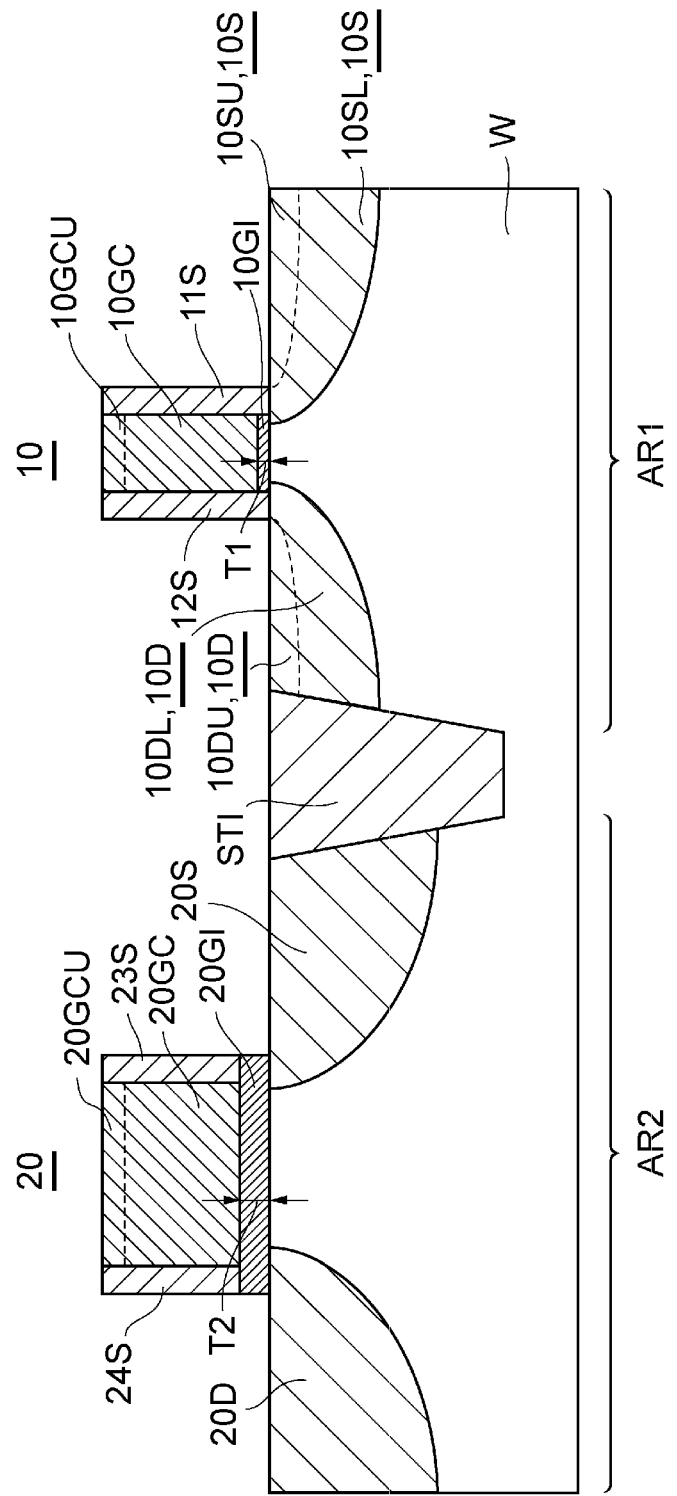
FIG. 1 is a cross-sectional view schematically showing the configuration of transistors provided in a semiconductor device according to an embodiment.

Embodiments provide a semiconductor device having a configuration suited to size reduction of transistors, and a method for manufacturing the semiconductor device.

In general, according to one embodiment, a semiconductor device comprises a transistor, the transistor comprising: a gate insulating film formed on a semiconductor substrate; a gate electrode formed on the gate insulating film and containing germanium at least in an upper region of the electrode; a source region formed in the semiconductor substrate; and a drain region formed in the semiconductor substrate.

According to another embodiment, a method for manufacturing a semiconductor device comprises the steps of: forming a gate insulating film having a first thickness on a first area of a semiconductor substrate; forming an insulating film, having a second thickness which is larger than the first thickness and partly including a second gate insulating film, on a second area of the semiconductor substrate; forming a gate electrode on the gate insulating film; forming a second gate electrode on the second gate insulating film; forming a spacer insulating film on the semiconductor substrate and the gate electrode in the first area, and on the insulating film and the second gate electrode in the second area; and implanting germanium through the spacer insulating film into an upper region of the semiconductor substrate and an upper region of the gate electrode in the first area, and into an upper region of the second gate electrode in the second area, thereby amorphizing the regions.

According to yet another embodiment, a method for manufacturing a semiconductor device comprises the steps of: forming a gate insulating film on a first area of a semiconductor substrate; forming a second gate insulating film on a second area of the semiconductor substrate; forming a gate electrode on the gate insulating film; forming a second gate electrode on the second gate insulating film; forming a first side wall and a second side wall on side surfaces of the gate electrode; forming a third side wall and a fourth side wall on side surfaces of the second gate electrode; forming, on the gate electrode in the first area, a first resist film which covers the second side wall and exposes a first upper end portion located adjacent to the first side wall; forming, on the second gate electrode in the second area, a second resist film which covers the third side wall and the fourth side wall and exposes an intermediate portion of an upper region of the second gate electrode; and implanting germanium from above the first resist film and the second resist film into the first upper end portion of the gate electrode in the first area, and into the intermediate portion of the second gate electrode in the second area, thereby amorphizing the portions.

The steps of the semiconductor device manufacturing methods may not necessarily be performed in the particular order described above; any change may be made to the above-described order as long as the change is reasonably conceivable by one skilled in the art.

Embodiments of the present disclosure will now be described with reference to the attached drawings. For easier understanding of the drawings and the description below, same symbols are used for the same or similar components or elements as much as possible, and a duplicate description thereof is omitted.

First Embodiment

FIG. 1 is a cross-sectional view schematically showing the configuration of transistors provided in a semiconductor device 100 according to a first embodiment. As shown in FIG. 1, the semiconductor device 100 has two types of transistors. One transistor is a VLV (Very Low Voltage) transistor 10. The other transistor is an HV (High Voltage) transistor 20. The VLV transistor 10 and the HV transistor 20 constitute, for example, transistors of a CMOS logic circuit formed in the same semiconductor substrate W, though the VLV transistor 10 and the HV transistor 20 may be formed in different semiconductor substrates.

The HV transistor 20 can be used at a higher voltage than the VLV transistor 10. Therefore, the HV transistor 20 can be formed in an area AR2 (sometimes referred to as a "second area AR2") of the semiconductor substrate W where a circuit which operates at a relatively high voltage is provided, while the VLV transistor 10 can be formed in another area AR1 (sometimes referred to as a "first area AR1"). The second area AR2 where the HV transistor 20 is provided and the first area AR1 where the VLV transistor 10 is provided are separated e.g. by an STI. The configuration of each transistor will now be described.

[VLV Transistor]

The VLV transistor 10 includes a first gate insulating film 10GI formed on the semiconductor substrate W, a first gate electrode 10GC (also referred to as a "gate contact") formed on the first gate insulating film 10GI, and a first source region 10S and a first drain region 10D, formed in the semiconductor substrate W. The VLV transistor 10 also includes a first side wall 11S provided such that it faces one side surface of the first gate electrode 10GC, and a second side wall 12S provided such that it faces the opposite side surface of the first gate electrode 10GC. The semiconductor device 100 further includes a source contact, a drain contact, and a gate contact which are electrically connected to the first source region 10S, the first drain region 10D, and the first gate electrode 10GC, respectively, an insulating layer for insulating the VLV transistor 10 and other transistors, etc. The present disclosure is applicable to both N-type transistors and P-type transistors.

The semiconductor substrate W is, for example, a P-type or N-type silicon wafer.

In an example, the first gate insulating film 10GI has a thickness T1 (an example of "first thickness") of 0.5 nm to 1 nm (e.g., 0.8 nm). In an example, the gate length of the first gate insulating film 10GI is 50 nm to 100 nm (e.g., 50 nm). A gate insulating film including the first gate insulating film 10GI is, for example, formed of $SiO_2$ or SiN.

The first gate electrode 10GC is formed on the first gate insulating film 10GI. In an example, the first gate electrode 10GC has a height of 50 to 150 nm (e.g., 100 nm). The first gate electrode 10GC and other gate electrodes are, for example, formed of polysilicon. An upper region 10GCU of the first gate electrode 10GC has been implanted with germanium (Ge) and amorphized by pre-amorphization implant (hereinafter sometimes referred to as "PAI") as will be described later. The PAI has only a limited or no influence on a lower region of the first gate electrode 10GC; therefore, the lower region contains substantially no germanium.

The first source region 10S is, for example, a P-type diffusion region into which boron (B) has been implanted and diffused. An upper source region 10SU of the first source region 10S, which is provided adjacent to the surface of the semiconductor substrate W, has been implanted with germanium (Ge) and amorphized by PAI. The PAI has only a limited or no influence on a lower source region 10SL located farther from the surface of the semiconductor substrate W than the upper source region 10SU; therefore, the lower source region 10SL contains substantially no germanium.

Since the upper source region 10SU of the first source region 10S has been amorphized, it can prevent diffusion of impurities (boron in this embodiment), thereby reducing variation in the properties of the transistor.

The first drain region 10D is, for example, a P-type diffusion region into which boron (B) has been implanted and diffused. An upper drain region 10DU of the first drain region 10D, which is provided adjacent to the surface of the semiconductor substrate W, has been implanted with germanium (Ge) and amorphized by PAI. The PAI has only a limited or no influence on a lower drain region 10DL located farther from the surface of the semiconductor substrate W than the upper drain region 10DU; therefore, the lower drain region 10DL contains substantially no germanium.

Since the upper drain region 10DU of the first drain region 10D has been amorphized, it can prevent diffusion of impurities (boron in this embodiment), thereby reducing variation in the properties of the transistor.

[HV Transistor]

The HV transistor 20 is formed in the second area AR2 of the same semiconductor substrate W. The HV transistor 20 includes a second gate insulating film 20GI, a second gate electrode 20GC formed on the second gate insulating film 20GI and containing germanium at least in its upper region, a second source region 20S formed in the semiconductor substrate W, and a second drain region 20D formed in the semiconductor substrate W. The HV transistor 20 also includes a third side wall 23S provided such that it faces one side surface of the second gate electrode 20GC, and a fourth side wall 24S provided such that it faces the opposite side surface of the second gate electrode 20GC.

The semiconductor device 100 further includes a source contact, a drain contact, and a gate contact which are electrically connected to the second source region 20S, the second drain region 20D, and the second gate electrode 20GC, respectively, insulating layers stacked on the semiconductor substrate W for insulating the HV transistor 20 and other transistors, etc. The HV transistor 20, in which the third side wall 23S and the fourth side wall 24S are formed on the second gate insulating film 20GI, differs in configuration from the VLV transistor 10 in which the first gate insulating film 10GI is formed between the first side wall and the second side wall.

The second gate insulating film 20GI has a larger thickness than the first gate insulating film 10GI. In an example, the second gate insulating film 20GI has a thickness T2 (an example of "second thickness") of 1 nm to 5 nm (e.g., 3 nm). The gate length of the second gate insulating film 20GI may be longer than the gate length of the first gate insulating film 10GI. In an example, the gate length of the second gate insulating film 20GI is 10 nm to 100 nm (e.g., 50 nm).

The second gate electrode 20GC is formed on the second gate insulating film 20GI. The second gate electrode 20GC may be formed such that it has the same height as the first gate electrode 10GC. In an example, the second gate electrode 20GC has a height of 50 to 150 nm (e.g., 100 nm). An upper region 20GCU of the second gate electrode 20GC has been implanted with germanium (Ge) and amorphized by PAI. The PAI has only a limited or no influence on a lower region of the second gate electrode 20GC; therefore, the lower region contains substantially no germanium.

The second source region 20S is, for example, a P-type diffusion region into which boron (B) has been implanted and diffused. Unlike the first source region 10S, the PAI has only a limited or no influence on the entire region, including an upper region, of the second source region 20S; therefore, the second source region 20S contains substantially no germanium. An LDD (Lightly Doped Drain) is formed adjacent the second source region 20S.

The second drain region 20D is, for example, a P-type diffusion region into which boron (B) has been implanted and diffused. Unlike the first drain region 10D, the PAI has only a limited or no influence on the entire region, including an upper region, of the second drain region 20D; therefore, the second drain region 20D contains substantially no germanium. An LDD (Lightly Doped Drain) is formed adjacent the second drain region 20D.

According to the HV transistor 20 having the above-described configuration, at least an upper region of the second gate electrode 20GC has been implanted with germanium (Ge) and amorphized by PAI. Accordingly, upon implantation of a dopant for the formation of the LDDs (Lightly Doped Drains), the dopant can be prevented from passing through the second gate electrode 20GC and being implanted into a channel region of the semiconductor substrate W, causing a variation in the threshold voltage.

In order to improve the aspect ratio of a transistor, especially that of a VLV transistor, when reducing the gate length of the transistor for achieving a size reduction of the transistor, it is necessary to reduce the height of a gate electrode. When the height of the gate electrode is reduced, a dopant is likely to pass through the gate electrode and to be implanted into a channel region of a semiconductor substrate particularly when forming an LDD in an HV transistor, causing a variation in the threshold voltage. Focusing on this fact, the present inventors have conceived of the idea of performing PAI on a gate electrode (in particular a second gate electrode of an HV transistor) to implant germanium (Ge) into the gate electrode and amorphize at least a part of an upper region of the gate electrode, thereby preventing a dopant from passing through the gate electrode.

According to the above-described configuration, a dopant can be prevented from passing through a gate electrode and being implanted into a channel region of a semiconductor substrate. This makes it possible to provide a semiconductor device which can reduce the variation in the threshold voltage of a transistor associated with a reduction in the size of the transistor.

Unlike the gate electrode (the second gate electrode 20GC), the diffusion regions (the second source region 20S and the second drain region 20D) of the HV transistor have not been subjected to PAI. This enables a reduction of a GIDL (gate-induced drain-leakage) current.

As described hereinabove, the semiconductor device of this embodiment has the two types of transistors. With reference to the transistor (VLV transistor) having a relatively small thickness of the gate insulating film, the diffusion layers (source and drain regions) are subjected to PAI to prevent diffusion of impurities. This enables enhancement of properties. On the other hand, with reference to the transistor (HV transistor) having a relatively large thickness of the gate insulating film, the diffusion layers (source and drain regions) are not subjected to PAI. This enables a reduction of a GIDL current. In addition, the gate electrode is subjected to PAI. This enables a reduction of the variation of the threshold voltage associated with the formation of the LDDs.

[Manufacturing Method]

A method for manufacturing the semiconductor device 100 of this embodiment will now be described. FIGS. 2 and 3 are schematic diagrams illustrating a method for manufacturing the semiconductor device 100 of this embodiment. First, as shown in FIG. 2A, an insulating film, which is to become a first gate insulating film 10GI, is formed on a first area AR1 of a semiconductor substrate W e.g. by oxidation of the surface of the semiconductor substrate W. Similarly, an insulating film, which is to become a second gate insulating film 20GI having a thickness T2 which is larger than the thickness T1 of the first gate insulating film 10GI, is formed on a second area AR2 of the semiconductor substrate W.

Next, a polysilicon film, which is to become a first gate electrode 10GC and a second gate electrode 20GC, is formed on the insulating films in the first area AR1 and the second area AR2 e.g. by CVD. Subsequently, part of the polysilicon film is removed by patterning to form, in the first area AR1, a first gate insulating film 10GI having a thickness T1 and a first gate electrode 10GC on the first gate insulating film 10GI.

Further, part of the polysilicon film is removed by patterning to form, in the second area AR2, a second gate electrode 20GC on the insulating film which is to become a second gate insulating film 20GI. The insulating film is not removed by the patterning, and is allowed to remain on the semiconductor substrate W. This enables the formation of the insulating film having a thickness T2, partly including the second gate insulating film 20GI, in the second area AR2 as shown in FIG. 2A.

Next, as shown in FIG. 2B, a spacer insulating film SI, which is to become side walls, is formed in the first area AR1 and the second area AR2 of the semiconductor substrate W. In particular, the spacer insulating film SI is formed e.g. by CVD on the semiconductor substrate W and the first gate electrode 10GC in the first area AR1, and on the insulating film and the second gate electrode 20GC in the second area AR2.

Next, as shown in FIG. 2C, PAI is performed on the semiconductor device 100 covered with the spacer insulating film SI. In particular, germanium is implanted through the spacer insulating film SI into upper regions (corresponding to a region which is to become an upper source region 10SU and a region which is to become an upper drain region 10DU) of the semiconductor substrate W in the first area AR1 to amorphize the region. Further, germanium is implanted into an upper region 10GCU of the first gate electrode 10GC to amorphize the region.

At the same time, germanium is implanted into an upper region 20GCU of the second gate electrode 20GC in the second area AR2 to amorphize the region. Since upper regions (corresponding to a portion which is to become an upper region of a second source region 20S and a portion which is to become an upper region of a second drain region 20D) of the semiconductor substrate W in the second area AR2 are covered with the thick insulating film provided under the spacer insulating film SI, germanium is not implanted into the upper region of the semiconductor substrate W, and therefore the regions are not amorphized. In other words, PAI for germanium implantation is performed at an acceleration voltage at which germanium passes through the spacer insulating film SI, but does not pass through the insulating film located under it. This makes it possible to manufacture transistors having the configuration shown in FIG. 1.

The above-described process makes it possible to form, on the same semiconductor substrate W, at least the two types of transistors, namely the transistor (VLV transistor) containing germanium in an upper region of the gate electrode and in upper regions of the diffusion layers (source and drain regions), and the transistor (HV transistor) containing germanium in an upper region of the gate electrode, but not containing germanium in the diffusion layers.

Figure 3B:
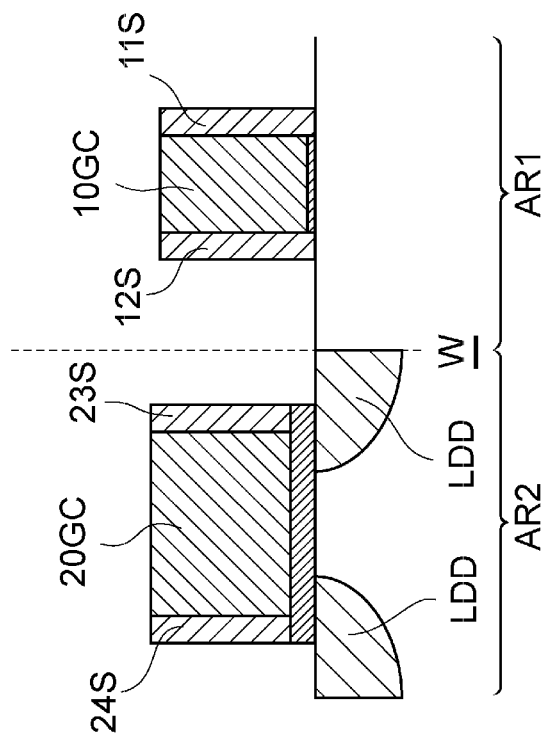
FIGS. 3A and 3B are schematic diagrams illustrating the method for manufacturing the semiconductor device according to the embodiment.
Figure 3A:
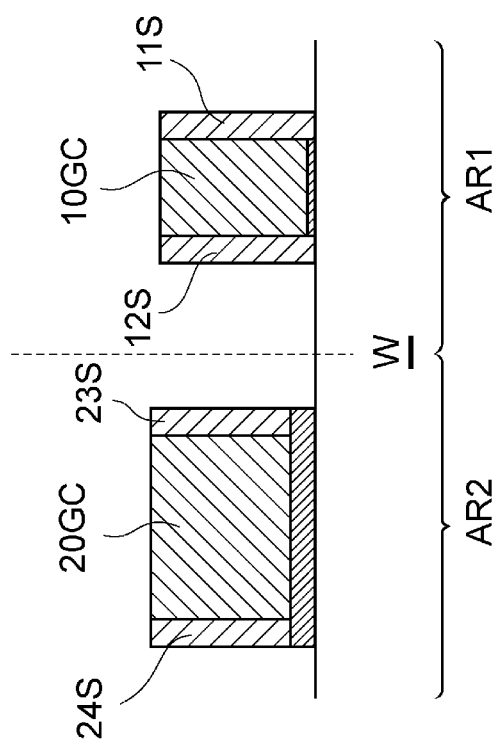

Thereafter, as shown in FIG. 3A, the spacer insulating film SI, formed on the entire substrate surface, is etched back by anisotropic etching, such as RIE, to remove the spacer insulating film SI in such a manner that part of the spacer insulating film SI, corresponding to the side walls, remains unetched.

Subsequently, as shown in FIG. 3B, a dopant (e.g. phosphorus) is implanted to form LDDS. Since the upper region of the second gate electrode 20GC has been amorphized, at least part of the dopant is blocked by the second gate electrode 20GC. This can prevent the dopant from being implanted into a channel region, causing a variation in the threshold voltage.

Thereafter, diffusion layers, etc. are formed by a known method. The transistors shown in FIG. 1 can thus be manufactured.

Second Embodiment

A second embodiment will now be described. For a configuration or feature which will be readily understood to be the same as in the first embodiment by one skilled in the art, a description thereof is simplified or omitted. Thus, the following description focuses on differences from the first embodiment.

FIGS. 4A and 4B are cross-sectional views schematically showing the configuration of HV transistors provided in a semiconductor device 200 according to the second embodiment. The HV transistor 30 shown in FIG. 4B and the HV transistor 40 shown in FIG. 4A may be formed in the same semiconductor substrate W or in different semiconductor substrates. For example, the HV transistor 30 shown in FIG. 4B may be provided in a peripheral portion constituting a peripheral circuit of a semiconductor memory, while the HV transistor 40 shown in FIG. 4A may be provided in a core portion of a semiconductor memory in the same semiconductor substrate W. The VLV transistor 10 according to the first embodiment may be provided in the same semiconductor substrate W.

The transistors of this embodiment have a configuration in which only a part of an upper region of the gate electrode contains germanium and is amorphous, while the other part contains substantially no germanium and is polycrystalline.

In the HV transistor 30 shown in FIG. 4B, the source region and the drain region are provided symmetrically, whereas in the HV transistor 40 shown in FIG. 4A, the source region and the drain region are provided asymmetrically which is a difference therebetween.

The HV transistor 30 shown in FIG. 4B includes a first gate insulating film 30GI formed on the semiconductor substrate W, a first gate electrode 30GC formed on the first gate insulating film 30GI, and a first source region 30S and a first drain region 30D, formed in the semiconductor substrate W. The HV transistor 30 also includes a first side wall 31S provided such that it faces one side surface of the first gate electrode 30GC, and a second side wall 32S provided such that it faces the opposite side surface of the first gate electrode 30GC. The semiconductor device 200 further includes a source contact, a drain contact, and a gate contact which are electrically connected to the first source region 30S, the first drain region 30D, and the first gate electrode 30GC, respectively, an insulating layer for insulating the HV transistor 30 and other transistors, etc.

An intermediate portion 30UM of an upper region 30U of the first gate electrode 30GC, corresponding to an intermediate region between the first side wall 31S and the second side wall 32S, contains germanium and is amorphous.

On the other hand, a first upper end portion 30U1 of the upper region 30U of the first gate electrode 30GC, located nearer to the first side wall 31S than the intermediate portion 30UM, contains substantially no germanium and is polycrystalline.

Similarly, a second upper end portion 30U2 of the upper region 30U of the first gate electrode 30GC, located nearer to the second side wall 32S than the intermediate portion 30UM, contains substantially no germanium and is polycrystalline.

An LDD (source LDD) is formed in a region of the semiconductor substrate W, located below and corresponding to the first upper end portion 30U1. An LDD (drain LDD) is formed in a region of the semiconductor substrate W, located below and corresponding to the second upper end portion 30U2.

According to the HV transistor 30 having the above-described configuration, the intermediate portion 30UM of the upper region 30U of the first gate electrode 30GC is amorphous. Accordingly, upon the formation of the LDDs, a dopant (e.g., phosphorus) can be prevented from passing through the intermediate portion 30UM and being implanted into a channel region.

In addition, it becomes possible to form the LDDs below end portions of the first gate insulating film 30GI. This enables a reduction of a GIDL current.

The HV transistor 40 shown in FIG. 4A includes a first gate insulating film 40GI formed on the semiconductor substrate W, a first gate electrode 40GC formed on the first gate insulating film 40GI, and a first source region 40S and a first drain region 40D, formed in the semiconductor substrate W. The HV transistor 40 also includes a first side wall 41S provided such that it faces one side surface of the first gate electrode 40GC, and a second side wall 42S provided such that it faces the opposite side surface of the first gate electrode 40GC. The semiconductor device 200 further includes a source contact, a drain contact, and a gate contact which are electrically connected to the first source region 40S, the first drain region 40D, and the first gate electrode 40GC, respectively, an insulating layer for insulating the HV transistor 40 and other transistors, etc.

An intermediate portion 40UM of an upper region 40U of the first gate electrode 40GC, corresponding to an intermediate region between the first side wall 41S and the second side wall 42S, contains germanium and is amorphous.

A first upper end portion 40U1 of the upper region 40U of the first gate electrode 40GC, located nearer to the first side wall 41S than the intermediate portion 40UM, also contains germanium and is amorphous.

On the other hand, a second upper end portion 40U2 of the upper region 40U of the first gate electrode 40GC, located nearer to the second side wall 42S than the intermediate portion 40UM, contains substantially no germanium and is polycrystalline.

An LDD (source LDD) is not formed in a region of the semiconductor substrate W, located below and corresponding to the first upper end portion 40U1, whereas an LDD (drain LDD) is formed in a region located below and corresponding to the second upper end portion 40U2.

In addition, an upper source region 40SU of the first source region 40S, located adjacent to the surface of the semiconductor substrate W, has been implanted with germanium (Ge) and amorphized by PAI, and therefore constitutes a shallow LDD.

On the other hand, unlike the first source region 40S, the first drain region 40D contains substantially no germanium over the entire region. Further, the first drain region 40D is formed deeper than the first source region 40S.

According to the HV transistor 40 having the above-described configuration, the relatively shallow LDD is formed in the first source region 40S. This enables a reduction of SCEs (Short Channel Effects). Further, the relatively deep LDD is formed in the first drain region 40D. This enables a reduction of a GIDL current. The HV transistor 40 is therefore applicable in a circuit (e.g., a core portion) that requires a high amplification.

A method for manufacturing the semiconductor device 200 of this embodiment will now be described. FIGS. 5 and 6 are schematic diagrams illustrating a method for manufacturing the semiconductor device 200 of this embodiment.

The HV transistor 30 having the symmetric diffusion layers and the HV transistor 40 having the asymmetric diffusion layers may be formed simultaneously on the semiconductor substrate W. In this embodiment, the symmetric HV transistor 30 is formed in a predetermined area (hereinafter sometimes referred to as a "first area") of the semiconductor substrate W, while the asymmetric HV transistor 40 is formed in a different predetermined area (hereinafter sometimes referred to as a "second area").

Figure 5A:
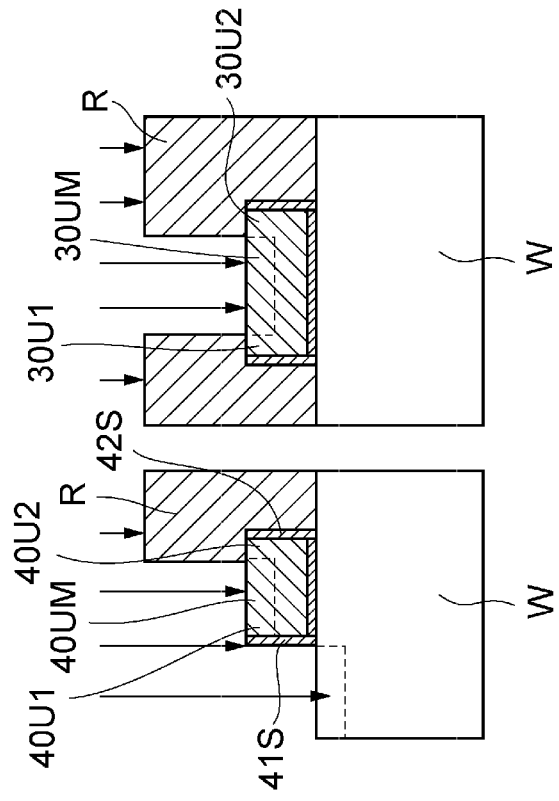
FIGS. 5A and 5B are schematic diagrams illustrating a method for manufacturing the semiconductor device according to the other embodiment.

As shown in FIG. 5A, the first gate insulating films 30GI, 40GI, the first gate electrodes 30GC, 40GC, and the first side walls 31, 41S and the second side walls 32S, 42S, which face the two side surfaces of each gate electrode, are formed in the first and second areas, respectively, of the semiconductor substrate W.

Figure 5B:
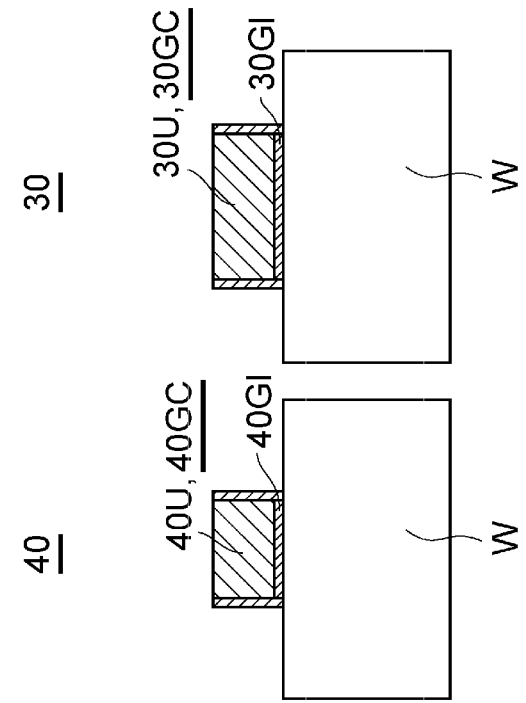

Next, as shown in FIG. 5B, in the first area of the semiconductor substrate W, a resist film R is formed which covers the first side wall 31S and the second side wall 32S, and exposes at least an intermediate portion 30UM of an upper region 30U of the first gate electrode 30GC. In the second area of the semiconductor substrate W, a resist film R is formed which covers the second side wall 42S and exposes at least an intermediate portion 40UM of an upper region 40U of the first gate electrode 40GC and the first side wall 41S. Subsequently, PAI is performed by implanting germanium from above the resist film R.

As a result, in the first area, the intermediate portion 30UM of the first gate electrode 30GC, which is not covered with the resist film R, is implanted with germanium and amorphized.

In the second area, the intermediate portion 40UM and a first upper end portion 40U1 of the upper region 40U of the first gate electrode 40GC, located nearer to the first side wall 41S than the intermediate portion 40UM, which are not covered with the resist film R are implanted with germanium and amorphized.

Figure 6A:
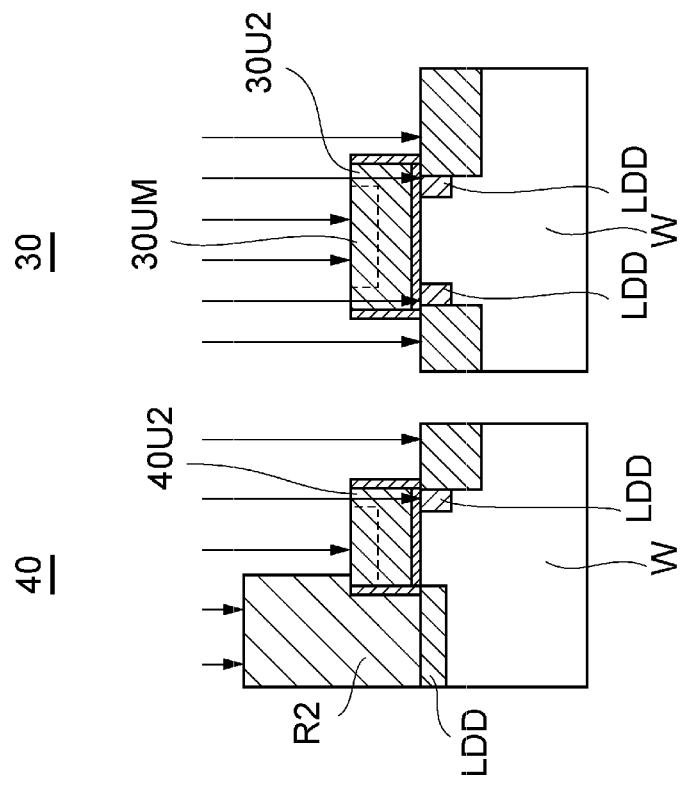
FIGS. 6A and 6B are schematic diagrams illustrating the method for manufacturing the semiconductor device according to the other embodiment.

Next, as shown in FIG. 6A, a dopant (e.g., phosphorus) is implanted to form an LDD while the resist film R remains on the substrate. The first gate electrode 40GC in the second area has been implanted with germanium and amorphized by PAI. Accordingly, upon implantation for the formation of the LDD, the dopant can be prevented from passing through the first gate electrode 40GC and being implanted into the semiconductor substrate W. Consequently, the LDD is formed in a region of the second area, which is not covered with the resist film R and which is to become a first source region 40S.

Figure 6B:
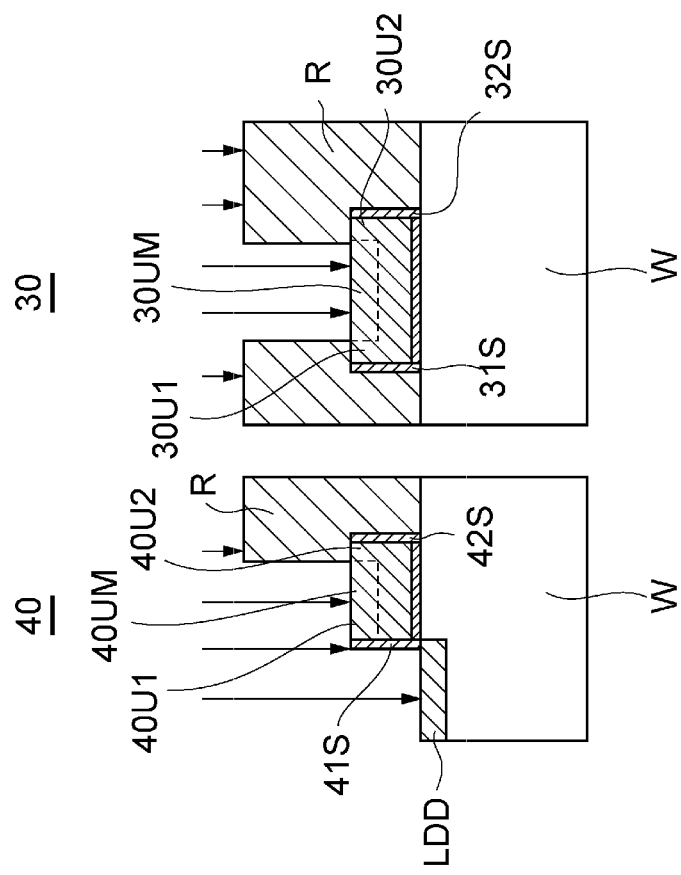

Subsequently, as shown in FIG. 6B, after removing the resist film R, a resist film R2 is formed which, in the second area, covers the first side wall 41S and exposes at least the intermediate portion 40UM of the upper region 40U of the first gate electrode 40GC and the second side wall 42S. Thereafter, a dopant (e.g., phosphorus) is implanted from above the resist film R2 to form LDDs.

In the first area, the first upper end portion 30U1 and the second upper end portion 30U2 have not been amorphized and are polycrystalline. Therefore, the dopant easily passes through the first upper end portion 30U1 and the second upper end portion 30U2. This enables the formation of a source LDD region and a drain LDD region under the source-side end and the drain-side end, respectively, of the first gate insulating film 30GI.

The second upper end portion 40U2 in the second area has not been amorphized and is polycrystalline. Therefore, the dopant passes through the second upper end portion 40U2, whereby an LDD is formed in a drain region. A higher dopant acceleration voltage is used for the formation of the LDD shown in FIG. 6B than that for the formation of the LDD shown in FIG. 6A. This enables the formation of the relatively deep LDD on the drain side.

Thereafter, diffusion layers, etc. are formed by a known method. A semiconductor device 200 including transistors having the configuration shown in FIG. 4 can thus be manufactured.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

For example, an upper end portion of an upper region of a gate electrode may be configured, not only to contain no germanium, but also to contain germanium at a concentration which is lower than the concentration of germanium in an intermediate portion (an example of a "first concentration") by allowing germanium to diffuse from the intermediate portion containing germanium into the upper end portion.

What is claimed is:

1. A semiconductor device comprising a transistor, the transistor comprising:
   a gate insulating film formed on a semiconductor substrate;
   a gate electrode formed on the gate insulating film and containing germanium at least in an upper region of the electrode;
   a source region formed in the semiconductor substrate; and
   a drain region formed in the semiconductor substrate;
   wherein the transistor comprises a first side wall provided such that it faces one side surface of the gate electrode, and a second side wall provided such that it faces the opposite side surface of the gate electrode, and wherein the upper region of the gate electrode includes an intermediate portion provided between the first side wall and the second side wall and containing germanium at a first concentration, a first upper end portion located nearer to the first side wall than the intermediate portion and containing germanium at a second concentration, and a second upper end portion located nearer to the second side wall than the intermediate portion and containing germanium at a concentration lower than the first concentration and the second concentration, or containing no germanium.

2. The semiconductor device according to claim 1, wherein the gate insulating film has a first thickness, the source region contains germanium, and the drain region contains germanium, and wherein the semiconductor device further comprises a second transistor comprising:
   a second gate insulating film formed on the semiconductor substrate and having a second thickness greater than the first thickness;
   a second gate electrode formed on the second gate insulating film and containing germanium at least in an upper region of the second gate electrode;
   a second source region formed in the semiconductor substrate and containing no germanium; and
   a second drain region formed in the semiconductor substrate and containing no germanium.

3. The semiconductor device according to claim 1, wherein the source region includes an upper source region containing germanium and located adjacent to the surface of the semiconductor substrate, and a lower source region containing no germanium and located farther from the surface of the semiconductor substrate than the upper source region, and wherein the drain region includes an upper drain region containing germanium and located adjacent to the surface of the semiconductor substrate, and a lower drain region containing no germanium and located farther from the surface of the semiconductor substrate than the upper drain region.

4. The semiconductor device according to claim 2, wherein the transistor comprises a first side wall provided such that it faces one side surface of the gate electrode, and a second side wall provided such that it faces the opposite side surface of the gate electrode, and wherein the second transistor comprises a third side wall provided such that it faces one side surface of the second gate electrode, and a fourth side wall provided such that it faces the opposite side surface of the second gate electrode, the third side wall and the fourth side wall being formed on the second gate insulating film.

5. The semiconductor device according to claim 1, wherein the transistor comprises a first side wall provided such that it faces one side surface of the gate electrode, and a second side wall provided such that it faces the opposite side surface of the gate electrode, and wherein the upper region of the gate electrode includes an intermediate portion provided between the first side wall and the second side wall and containing germanium at a first concentration, a first upper end portion located nearer to the first side wall than the intermediate portion and containing germanium at a concentration lower than the first concentration, or containing no germanium, and a second upper end portion located nearer to the second side wall than the intermediate portion and containing germanium at a concentration lower than the first concentration, or containing no germanium.

6. The semiconductor device according to claim 5, wherein the transistor further comprises a source LDD region formed in the semiconductor substrate at a position located below and corresponding to the first upper end portion, and a drain LDD region formed in the semiconductor substrate at a position located below and corresponding to the second upper end portion.

7. The semiconductor device according to claim 1, wherein the source region of the transistor includes an upper source region containing germanium and including the surface of the semiconductor substrate, and a lower source region containing no germanium and extending deeper than the upper source region, and wherein the drain region of the transistor contains no germanium.

8. A semiconductor device comprising the transistor according to claim 4, formed in the semiconductor substrate.

9. A semiconductor device comprising the transistor according to claim 6, formed in the semiconductor substrate.

* * * * *